United States Patent [19]

Kishida et al.

[11] Patent Number: 4,976,930
[45] Date of Patent: Dec. 11, 1990

[54] METHOD AND APPARATUS FOR INDUCING PHOTOCHEMICAL REACTION

[75] Inventors: Shunji Kishida; Hiroyuki Yokoyama; Yukio Morishige; Kunihiko Washio, all of Tokyo, Japan

[73] Assignee: NEC Corporation, Tokyo, Japan

[21] Appl. No.: 393,070

[22] Filed: Aug. 3, 1989

Related U.S. Application Data

[63] Continuation of Ser. No. 129,328, Dec. 3, 1987, abandoned, which is a continuation of Ser. No. 755,128, Jul. 15, 1985, abandoned.

[30] Foreign Application Priority Data

Jul. 17, 1984 [JP] Japan ............................ 59-148145
Jul. 17, 1984 [JP] Japan ............................ 59-148146
Mar. 28, 1985 [JP] Japan ............................ 60-61807

[51] Int. Cl.$^5$ .................. B01J 19/08; C01G 37/00; H03F 7/00; B23K 26/00
[52] U.S. Cl. ............................ 422/186.3; 422/186; 423/53; 423/54; 219/121.6; 219/121.61; 204/DIG. 11; 307/427
[58] Field of Search ............... 204/DIG. 11; 423/53, 423/54; 219/121.61, 121.6; 422/186.3, 186; 307/427

[56] References Cited

U.S. PATENT DOCUMENTS 3,941,670  3/1976  Pratt, Jr. .................... 332/7.51 X
3,949,323  4/1976  Bierlein et al. ............... 332/7.51
3,984,675  10/1976 Corcoran et al. ............. 332/7.51
4,183,780  1/1980  McKenna et al. ......... 422/186.05 X
4,200,669  4/1980  Schaefer et al. ........... 204/DIG. 11

FOREIGN PATENT DOCUMENTS 57-67161   4/1982  Japan .
0012128    1/1985  Japan ......................... 422/186
693800    11/1983  Switzerland ............. 204/DIG. 11

OTHER PUBLICATIONS

Solanki et al., Applied Physics Letters, Apr. 1981, vol. 38, pp. 572-574
Solanki et al., Applied Physics Letters, Dec. 1982, vol. 41, pp. 1048-1050.
A Pulsed and Quasi-CW Actively Mode-Locked Nd:Phosphate Glass Oscillator, Zheng Yuxia et al, IEEE Journal of Quantum Electronics, vol. QE-17, No. 9, Sep. 1981.
Kilohertz Synchronous Amplification of 85-Femtosecond Optical pulses, Duling, III et al, J. of Opt. Suc. Am. Bl, vol. 2, No. 4, Apr. 1985.
Multikilohertz Pockets Cell Driver, P. Bado and M. Bouvier, Rev. Sci. Instrum., 56(9) Sep. 1985, p. 1744.
IBM Tech. Discl. Bull., Laser Etching Management, T. J. Harris & B. P. F. Wu, vol. 10, No. 1, 6/1967.
Conference on Laser and Electro-Optics Technical Digest, Jun. 19-22, 1984.

Primary Examiner—John S. Maples
Assistant Examiner—Philip Tucker
Attorney, Agent, or Firm—Sughrue, Mion, Zinn, Macpeak & Seas

[57]    ABSTRACT

According to a method and apparatus for inducing a photochemical reaction, a substrate is placed in a closed cell with a window for transmitting an ultraviolet beam therethrough and is located to oppose the window, a gas is filled to cause the phtoochemical reaction upon irradiation of the ultraviolet beam into the cell, ultraviolet pulses are repetitively controlled to emit at a predetermined intensity, an ultraviolet beam size and shape are adjusted in accordance with a size and a shape of an irradiation portion of the substrate, the repetition frequency of the ultraviolet beam is adjusted and set to effectively cause the photochemical reaction on the substrate in accordance with the adjusted ultraviolet beam size and shape, and the ultraviolet beam having the set beam size and shape at the repetition frequency is irradiated through the window of the cell.

7 Claims, 2 Drawing Sheets

METHOD AND APPARATUS FOR INDUCING PHOTOCHEMICAL REACTION

This is a continuation of application Ser. No. 07/129,328 now abandoned, filed Dec. 3, 1987 which is a continuation of application Ser. No. 06/755,128 filed July 15, 1985 now abandoned.

BACKGROUND OF THE INVENTION

The present invention relates to a method and apparatus for inducing a photochemical reaction upon irradiation of light, especially, a laser beam.

In a recent process for manufacturing semiconductor devices such as LSIs, extensive studies have been made on photochemical vapor deposition (photo CVD) and photoetching with a view to obtaining low-temperature and contamination free processes, and simplifying manufacturing steps. An ultraviolet light source capable of causing electron excitation has been mainly used as a light source for photochemical reactions induced by light in photo CVD and photoetching. Typical examples are excimer lasers (wavelengths of 157 nm, 193 nm, 248 nm, 308 nm, etc.), and a second harmonic (a wavelength of 257 nm) of an Ar laser (a wavelength of 515 nm). However, these conventional light sources present the following problems.

When an excimer laser is used, a pressurized toxic gas container for handling a toxic gas such as $F_2$ or HCl, an exhaust gas processing unit, a unit for exhausting the gas into air, a leakage sensor, and various interlock mechanisms synchronized with the leakage sensor must be used. For this reason, the light source should have a large size and high cost and cannot be easily moved. In addition, high grade safety control is required. At present, therefore, the excimer laser cannot be used as a practical light source.

On the other hand, the second harmonic of the Ar laser has an output power of at best only several milliwatts. Even if a high power is obtained, the second harmonic continuously oscillates, so that a region of a photochemical reaction, induced by thermal diffusion on the substrate, becomes larger than the size of the beam spot, thereby failing to provide microprocessing on the order of micrometers. Although the second harmonic of the Ar laser does not have drawbacks caused by the use of toxic gases, it is an ultraviolet light source which is not suitable for photochemical reactions.

One of the candidates of practical ultraviolet light sources is exemplified in Japanese Patent Disclosure No. 57-67161 entitled "Laser Thin Film Formation Apparatus" whose embodiment describes an example using a fourth harmonic (a wavelength of 266 nm) of a Q switch Nd:YAG laser. In this description, $Cr(CO)_6$ is used. However, no specific reason is given for the selection of the light source. Nor is description made for the results of laser CVD.

When the fourth harmonic of the Q-switch Nd:YAG laser is actually used to induce a photochemical reaction, it is important to obtain a high-power fourth harmonic. In order to improve conversion efficiency of the harmonic generation, a flash-lamp excited Q-switch Nd:YAG laser with a high peak power is normally used. In this case, a possible high-power fourth harmonic has a repetition frequency of about 50 Hz, a peak power of about 100 kW and a pulse width of about 10 ns. Hence, the pulse width and the repetition frequency of the fourth harmonic are substantially the same as those of the excimer laser. In contrast, the peak power of the fourth harmonic is approximately one thousandth of that of the excimer laser. However, the peak power density per unit area of the fourth harmonic can be regarded as substantially the same as that of the excimer laser, in consideration of a difference between the sectional areas of the harmonic beam and the excimer laser beam. Therefore, when these beams irradiate corresponding substrates through identical optical systems, the characteristics of the fourth harmonic are substantially the same as those of the excimer laser. Under the above assumption, when the fourth harmonic is used to induce a photochemical reaction, the same results as in using the excimer laser are to be expected. In practice, the present inventors found that the same result as in using the excimer laser was obtained when Cr CVD was performed using $Cr(CO)_6$ gas. In this case, the drawbacks presented by use of the excimer laser can be eliminated. A fourth harmonic beam of the flash-lamp excited Q-switch Nd:YAG laser can provide the same photo CVD characteristics as the excimer laser can.

Even with the fourth harmonic of the flash-lamp excited Q-switch Nd:YAG laser having a high probability of practical application, the following problems occur in inducing the photochemical reactions.

Refractory metals such as tungsten (W), molybdenum (Mo) and chromium (Cr) are useful as a wiring or electrode material of LSIs. In laser CVD of Cr carbonyl $Cr(CO)_6$ is decomposed to deposit Cr on a substrate. In this case, Yokoyama et al. experimentally found (Conference on Laser and Electro-Optics Technical Digest, June 19-22, 1984) that a high quality metallic luster film could not be formed only by optical decomposition using a 50-Hz KrF excimer laser, but could be obtained when the deposited film was sufficiently heated simultaneously by light. This was also confirmed by the present inventors when the fourth harmonic of the flash-lamp excited YAG laser was used. According to another experiment of the present inventors using the same YAG laser, when the deposition area of Cr was decreased by decreasing the beam spot size down to less than several tens of micrometers, metallic luster of the deposited film was lost, thus degrading the quality of the film. In this case, when energy per pulse was increased so as to improve the heating effect, damage occurred in the film due to radiation, thereby failing to obtain a high-quality film.

According to reports for laser CVD of refractory metals, good films in small regions could not be obtained. For example, in a paper written by Solanki, Applied Physics Letter, Vol. 38, PP. 572-574, 1981, a film having a diameter of about 100 μm is deposited using a copper ion laser (a wavelength of 260 to 270 nm) at a repetition frequency of 40 Hz. In this paper, no description is made for the quality of the deposited film, hence it is difficult to ascertain that a film of high quality was obtained. In a paper written by Solanki, Applied Physics Letter, Vol. 41, PP. 1048-1050, 1982, a film of high quality was obtained by using an excimer laser, having a repetition frequency of up to 300 Hz. However, the area of the deposited film was as large as several square centimeters and no attempt was made to deposit a film in a small area of the order of micrometers to several tens of micrometers (hereafter abbreviated as microarea).

As is apparent from these conventional problems concerning light sources, conventional methods and apparatuses for inducing a photochemical reaction cannot adequately form a high quality CVD film in a microarea.

SUMMARY OF THE INVENTION

It is, therefore, a principal object of the present invention to eliminate the drawbacks of the conventional method and apparatus for inducing a photochemical reaction and to provide a method and apparatus for inducing a photochemical reaction wherein a photo CVD film can be accurately formed in a microarea.

In order to achieve the above objects of the present invention, there is provided a method of inducing a photochemical reaction, comprising the steps of: placing a substrate in a closed cell with a window for transmitting an ultraviolet beam therethrough, the substrate being located to oppose the window; filling a gas to be subjected to the photochemical reaction upon irradiation of the ultraviolet beam into the cell; emitting ultraviolet pulses with adjustable repetition frequency at a predetermined intensity; adjusting an ultraviolet beam size in accordance with a size of an irradiation portion of the substrate; adjusting and setting the repetition frequency of the ultraviolet beam so as to effectively cause the photochemical reaction on the substrate in accordance with the adjusted ultraviolet beam size; and radiating the ultraviolet beam having a set beam size at the repetition frequency through the window of the cell.

An apparatus for inducing a photochemical reaction according to the present invention comprises: a cell having a window for transmitting an ultraviolet beam therethrough and a holding mechanism for holding a substrate; a gas supply system for supplying a gas subjected to the photochemical reaction upon irradiation of the ultraviolet beam; a continuously excited Q-switch Nd:solid-state laser whose repetition frequency is adjusted by a Q switch controller; an ultraviolet harmonic generator for receiving an output from the continuously excited Q-switch Nd:solid-state laser and generating an ultraviolet harmonic; an optical system for guiding the ultraviolet harmonic from the ultraviolet harmonic generator onto the substrate through the window and adjusting an ultraviolet beam size in accordance with an irradiation area and a shape thereof of the substrate; and a control unit for supplying a control signal to the optical system and the continuously excited Q-switch Nd:solid-state laser and controlling the beam size and the repetition frequency such that the photochemical reaction on the substrate effectively occurs.

DETAILED DESCRIPTION OF THE PREFERRED EMBODIMENT

Figure 1:
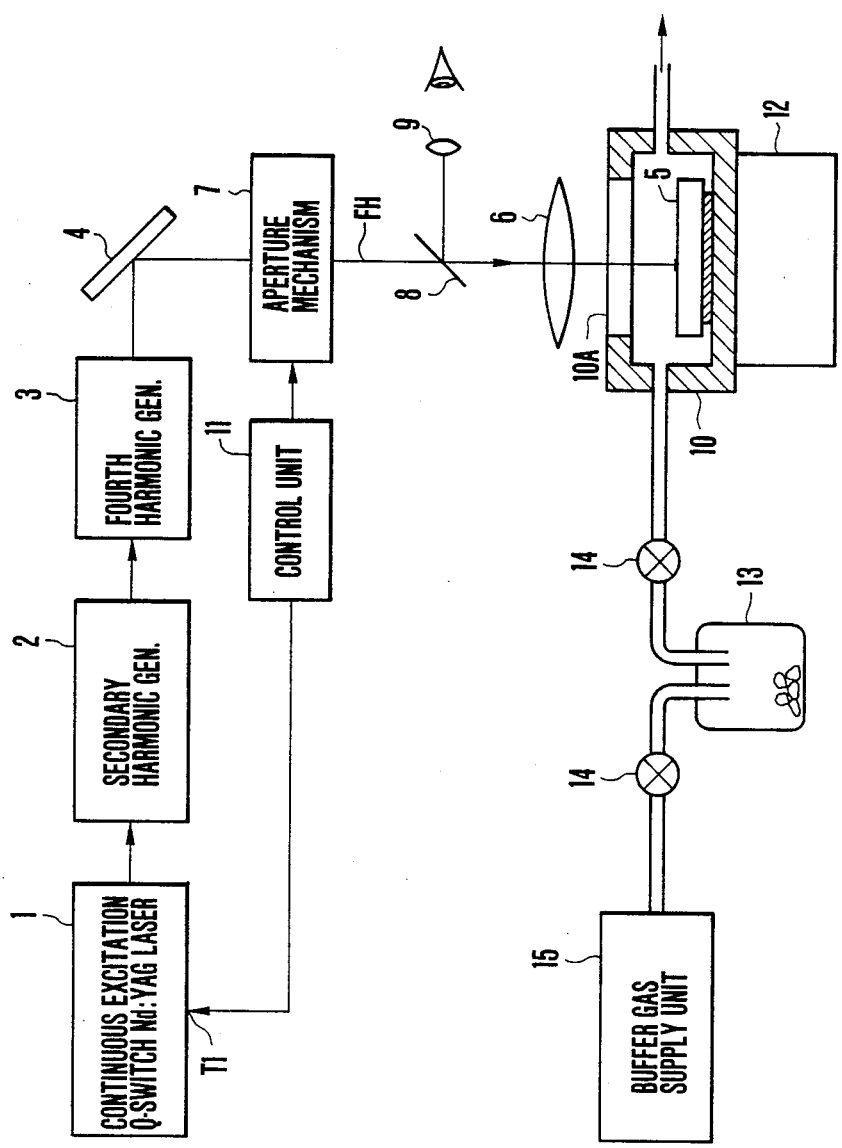
FIG. 1 is a diagram showing the overall system configuration of an apparatus for inducing a photochemical reaction according to an embodiment of the present invention.

A theory of photo CVD and experimental results obtained by the present inventors will be described so as to clarify conditions for achieving the present invention before a preferred embodiment is described.

The present invention is based on findings obtained by new speculations and experiments to be described later, wherein an ultraviolet light source having a repetition frequency of 400 Hz or more is used to greatly improve the quality of refractory metal films deposited by laser CVD in a microarea.

As previously described, a heating effect is required to form a good refractory metal film by means of photo CVD. One of the most important points in examining the heating effect is to consider the cooling process of a film deposited on a substrate. For example, when $Cr(CO)_6$ gas is used to deposit chromium on a glass substrate, only the Cr film absorbs laser beam energy. In general, when a film is deposited on a large area, only one-dimensional heat conduction along the vertical direction needs to be considered. However, when a film is deposited in a microarea, the thermal conduction must also be considered along lateral direction in a plane including the substrate surface. In other words, three-dimensional heat conduction occurs, and the cooling rate of the deposition film is increased. This can be typically observed when a size of a deposition film is smaller (i.e., several micrometers) than a heat diffusion length of the substrate. Based on such a technical consideration, an ultraviolet harmonic of a continuously excited Q-switch Nd:solid-state laser, especially, the fourth harmonic (a wavelength of 266 nm) of a continuously excited acousto-optic (AO) Q-switch Nd:YAG laser is used as a light source in place of the conventional fourth harmonic of the flash-lamp excited Q-switch YAG laser. This replacement leads to following disadvantages that pulse energy is decreased to about 1/1,000, a pulse width is elongated by 10 times, and the conversion efficiency of the laser beam to the fourth harmonic is decreased to 1/10 or less as compared with those of the flash-lamp excited Q-switch Nd:solid-state laser. However, the repetition frequency of the pulses can be increased to about 1 kHz, which is about 10 to 100 times larger than that of the conventional ultraviolet source. When a film is deposited by photo CVD on a microarea where heating is required, good deposition film formation can be obtained by this repetition frequency increase, as follows.

In photo CVD, when the repetition frequency of the light source is increased, the peak intensity per irradiated pulse can be made sufficiently smaller than a threshold value of an optical damage to the deposition film, and resultant shortage of an input level per pulse can be compensated by a sufficient heat accumulation effect obtained by an increase in the repetition frequency. In addition, the heat accumulation effect can be made to leads to a steady temperature of the film to a temperature of less than a CVD temperature. In this case, the actual CVD process occurs only when the transiently increased temperature, caused by the individual input pulses, exceeds the CVD temperature. Hence, the resultant film pattern will not be widened, unlike in steady heating, and accurately duplicates the irradiated area pattern.

An increase in the repetition frequency of the light source and the resultant temperature rise entails the following effect. It is expected that the amount of reaction species adsorbed on the substrate can be decreased. In general, the adsorption phenomenon greatly depends on a substrate temperature. It is known that the amount of adsorbates is rapidly decreased when a substate temperature is increased. For this reason, when the repetition frequency is increased while irradiation energy per pulse is kept unchanged, the substrate temperature immediately prior to pulse irradiation can be increased, and a cooling time interval for accelerating adsorption can be shortened. As a result, the amount of reaction species adsorbed on the substrate can be decreased. When a thickness of a layer subjected to energy absorption or a gas adsorption layer, that is, the amount of adsorbates, is too large, however, a nondecomposed component tends to be mixed as an impurity in the film deposited on the substrate upon irradiation, thereby degrading the film quality. In order to prevent this, it is expected that pulse irradiation at a certain higher repetition frequency is required. In addition, since the cooling rate of the deposition film is increased when an irradiation area is micronized, as previously described, a change in temperature variation which is caused by a change in irradiation area can be compensated by an increase in repetition frequency of the irradiation pulses. As a result, a change in film thickness can be decreased.

The present inventors made precise considerations concerning dependency of film temperature on repetition frequency and irradiation area. An experiment was made such that Cr film was deposited from a $Cr(CO)_6$ vapor by laser CVD on a glass substrate by using as a light source the fourth harmonic of the Q-switch YAG laser. The irradiation area and the irradiation beam shape were changed to examine the film quality. When the repetition frequency of the pulse was fixed at low level, the present inventors found that it is difficult to obtain a uniform film of high quality within a wide irradiation area of several micrometers to several tens of micrometers even if the peak power of the irradiation beam was changed. They also found that the quality of a film upon irradiation of a beam with an elongated sectional shape greatly differs from that of a film upon irradiation of a beam with a substantially circular sectional shape even if the irradiation areas were identical. These results lead to a conclusion that it is difficult to obtain a uniform deposition film when the irradiation area and shape vary in accordance with the conventional laser CVD technique having an indefinite repetition frequency of the pulse.

More particularly, concerning laser CVD using Cr derived from a $Cr(CO)_6$ vapor, the present inventors experimentally examined the dependency of film quality on the repetition frequency and the dependency of the film thickness and a deposition rate on the substrate temperature. A further experiment was made concerning changes in temperature of a deposition film in accordance with changes in irradiation area. More specifically, a transient temperature rise and a cooling rate upon irradiation of optical pulses were numerically calculated.

In an experiment under a condition wherein the repetition frequency was fixed, the following results were obtained. The dependency of film thickness on the irradiation area was examined when the repetition frequency was 2 kHz and a carbonyl vapor pressure was 1 Torr. When an irradiated beam spot had a diameter of 12 $\mu$m, a metallic luster film was deposited on the substrate within 10 seconds. However, when the beam spot had a diameter of 20 $\mu$m, a deposition rate was changed, and the film quality was degraded. These drawbacks could not be improved even if the irradiation beam intensity and the irradiation time were broadly changed. When the irradiated beam spot was smaller, i.e., 5 $\mu$m or less, the deposited film was transparent for visible light but absorbed the ultraviolet beam. In this case, metallic luster of the film was lost.

When the repetition frequency was changed under a condition wherein a good film having a diameter of 12 $\mu$m was deposited, good deposits each having diameters of 5 $\mu$m and 20 $\mu$m were obtained at the repetition frequencies of 4 kHz and 1 kHz, respectively. In an experiment wherein the irradiated beam shape was changed while the repetition frequency was fixed, good film quality could not be obtained without a specific beam diameter. Thus, the present inventors found that good films could be obtained for corresponding beam shapes when the repetition frequency was properly selected in accordance with the shape of the laser beam. According to these experiments, the present inventors concluded that good deposits could be obtained when the repetition frequency was selected in accordance with the irradiation beam area and its shape.

The causes for the dependency of the film quality on the repetition frequency of the pulse will be described more in detail hereinafter. In an experiment of the present inventors, under the conditions wherein a good deposit could be obtained upon irradiation of a beam spot having a diameter of 12 $\mu$m, a substrate temperature was intentionally increased from room temperature by several tens of degrees in centigrade. In this case, a deposition rate was greatly decreased. According to numerical calculations, a change in irradiation area did not substantially cause a change in peak temperature during irradiation of the optical pulses. In this case, the present inventors found that the change in irradiation area typically resulted in a change in temperature during a time interval when the temperature was decreased to about several tens of degrees in centigrade. These facts and a decomposition temperature (i.e., 150° C.) of carbonyl indicated that the change in cooling rate is not directly associated with the decomposition reaction of carbonyl but results in a change in thickness of an adsorption layer of CVD material molecules adsorbed on the substrate prior to pulse irradiation, and hence is indirectly associated with the film quality due to the change in thickness of the CVD material molecule layer. The relationship between the adsorption layer thickness and the deposited film quality is given as follows. In general, when the adsorption layer is excessively thick, the amount of a nondecomposed component after the reaction is increased. On the other hand, when the thickness of the adsorption layer is excessively small, the amount of fragments, decomposed in a gas phase and attached to the substrate, becomes appreciable in compared with that of the decomposition component from the adsorption layer. Hence, in both cases, degradation of the film quality should be caused.

In brief, it is very important to optimize a thickness of the CVD gas adsorption layer immediately prior to optical pulse irradiation so as to obtain a good film.

In a thermal equilibrium state, the thickness of the adsorption layer on the surface of the substrate can be controlled by a substrate temperature and a CVD gas pressure. However, during optical pulse irradiation, a local temperature rise occurs in only the irradiated area. As the time interval of pulse irradiation is generally shorter than that required to attain the thermal equilibrium state, the thickness of the CVD material adsorbed prior to the next pulse irradiation cycle is changed in accordance with the irradiated pulse intensity, the intervals of the repetitive pulses, and the cooling rate of the deposition film. When the deposition film shapes are circular and elongated, two- and one-dimensional thermal conduction effects occur along directions parallel to the film surfaces even if the film areas are identical, respectively. Therefore, the cooling rate of the film deposited on the substrate also depends on shape of the deposition film.

Based on these considerations, in order to obtain good film quality for any irradiation area and any beam shape, the optical pulse intensity and the repetition frequency must be controlled in accordance with the irradiation area and its shape, thereby controlling the thickness of the adsorption layer. In this case, it is difficult by irradiation intensity control to compensate for a change in thickness of the adsorption layer when an area is broadly changed. A good film can be obtained when a peak temperature of the film upon optical pulse irradiation is high. However, since evaporation of the deposition film occurs when the irradiation intensity is excessively high, the allowable range of the irradiation intensity is thereby narrow. As a result, the irradiation intensity cannot be broadly changed. On the other hand, the repetition frequency of the pulses can be arbitrarily changed without greatly influencing the peak temperature during optical pulse irradiation. For this reason, the thickness of the adsorption layer immediately prior to irradiation of each optical pulse can be decreased when the repetition frequency of the pulses is increased. And, the thickness of the adsorption layer can be increased when the repetition frequency is decreased. In this manner, the thickness of the adsorption layer can be arbitrarily controlled in accordance with the repetition frequency. When the change in thickness of the adsorption layer, which is caused by the change in irradiation area and its shape and the change in cooling rate, is compensated by properly selecting the repetition rate, good film quality can be obtained as described in the previous results.

Another method for controlling the thickness of the adsorption layer can be proposed wherein the temperature of the deposition cell or substrate or the vapor pressure of the CVD gas is changed in accordance with changes in irradiation area and radiation beam shape. However, the deposition cell has a long thermal response time, resulting in inconvenience.

A method and apparatus for inducing a photochemical reaction on the basis of the theory and experimental conditions described above will be described according to an embodiment of the present invention with reference to the accompanying drawings.

FIG. 1 is a diagram showing the overall system configuration of an apparatus for inducing a photochemical reaction. Referring to FIG. 1, reference numeral 1 denotes a continuous excitation (or continuously excited) Q-switch Nd:YAG laser (to be referred to as an Nd:YAG laser hereinafter). The Nd:YAG laser 1 is continuously excited by a Kr arc lamp and is repetitively Q-switched by an AOQ-switching element in the resonator at a high repetition frequency of about 1 kHz. A Q switch trigger circuit for controlling Q-switch has an external trigger terminal T1 which can be externally controlled in response to different automatic control signals. An output (a fundamental wave having a wavelength of 1.06 $\mu$m) from the Nd:YAG laser 1 can have a power of about 10 W in a TEM$_{00}$ mode so as to increase efficiencies of harmonics generations in the subsequent stages.

Reference numeral 2 denotes a second harmonic generator (SHG) which comprises CD*A(CsD$_2$AsO$_4$) or KTP(KTiOPO$_4$) which has high conversion efficiency. A typical conversion efficiency from the Nd:YAG laser beam to an SH beam (a wavelength of 533 $\mu$m) is 10%. In such a case, since the output from the Nd:YAG laser 1 can have a power of about 10 W in the TEM$_{00}$ mode, an average power of the SH beam can be expected to be about 1 W.

The second harmonic beam obtained by the SHG 2 is supplied to a fourth harmonics generator (FHG) 3. The FHG 3 converts the second harmonic to a fourth harmonic (a wavelength of 266 nm) by using KD*P(KD$_2$PO$_4$). In this case, the conversion efficiency is about 5 to 10%. As a result, the resultant FH (fourth harmonic) has a maximum average power of 50 to 100 mW. Among the output components from the FHG 3, only the FH component is extracted through a prism or a wavelength selection element such as a multilayer coating or an etalon.

The fourth harmonic from the FHG 3 is transmitted to an optical system including a reflection mirror 4, an aperture mechanism 7, a filter 8 and a lens 6 and is focused on a substrate 5 placed in a reaction cell 10 through a window 10A thereof. The FH pattern irradiated onto the substrate 5 is a transfer image of the aperture mechanism or a mask 7 obtained through the focusing lens 6. The transfer image can be arbitrarily controlled by a control unit 11. An irradiation position on the substrate 5 is monitored and focused by an eyepiece 9 arranged along a visible light optical path separated by the filter 8 from the FH beam. The filter 8 transmits an ultraviolet harmonic beam such as an FH beam but reflects an alignment visible light component. An automatic monitoring system using a TV monitor can be used instead of visual observation. The ultraviolet light transmission window 10A of quartz or the like for transmitting the FH beam therethrough is formed in the wall of the reaction cell 10. The reaction cell 10 can be controlled by a positioning mechanism 12 on the order of submicrons, so that the substrate 5 can be positioned with high precision.

The control unit 11 selects and sets an aperture size in the aperture mechanism 7 in accordance with the irradiation area and its shape. At the same time, the control unit 11 supplies a control signal to the control terminal T1 to control the Q-switch, so that the Q-switch is operated only on the irradiation time. As a result, the repetition frequency of the Nd:YAG laser 1 can be optimized for each irradiation area and its shape.

The reaction cell 10 is filled with a Cr(CO)$_6$ vapor diluted with Ar buffer gas. The photochemical source gas consisting of Cr(CO)$_6$ is supplied from a gas supply system. The gas supply system comprises a source reservoir 13, a cock 14, a buffer gas supply unit 15 and pipes for connecting these components. A Cr(CO)$_6$ powder is stored in the reservoir 13. Ar gas from the buffer gas supply unit 15 flows into the reservoir 13 upon opening/closing of the clock 14. The reservoir 13 and the reaction cell 10 are filled with a gas mixture at a saturated vapor pressure (about 1 Torr at room temperature).

In an operation of the apparatus for inducing a photochemical reaction as shown in FIG. 1, an FH beam having a beam size, shape and a repetition frequency which are controlled by the control unit 11 in accordance with the irradiation area of the substrate 5 is emitted from the FHG 3. The FH beam is irradiated onto the substrate 5 through the reflection mirror 4, the aperture mechanism 7, the filter 8, the lens 6 and the window 10A of the reaction cell 10. As is known well, carbonyl Cr(CO)$_6$ has a property of absorbing an ultraviolet beam and this induces the photochemical reaction at the irradiated area of the substrate, thereby depositing Cr on the irradiated area of the substrate 5.

For example, when the FH beam was irradiated onto the substrate 5 at an intensity of about 1 MW/cm$^2$ for about 10 seconds, a Cr deposit was formed only on the irradiated area. With this light beam, unlike the conventional excimer laser beam or the fourth harmonic beam of the flash-lamp excited Q-switch YAG laser, a Cr film was formed in a microarea having a diameter of several micrometers on the quartz substrate 5. An obtained minimum diameter of the Cr film was 1 μm. The present inventors also found that a pattern having a size of 2 μm square could be formed since the size was duplicated by the pattern of the aperture mechanism 7. It was also confirmed that adhesion of the Cr film to the substrate was very strong and the Cr film had sufficient smoothness, light-shielding property and electrical conduction. Experiments were conducted in which the beam size, the repetition frequency, the irradiation time, the light intensity and the like of the FH beam were changed.

Figure 2:
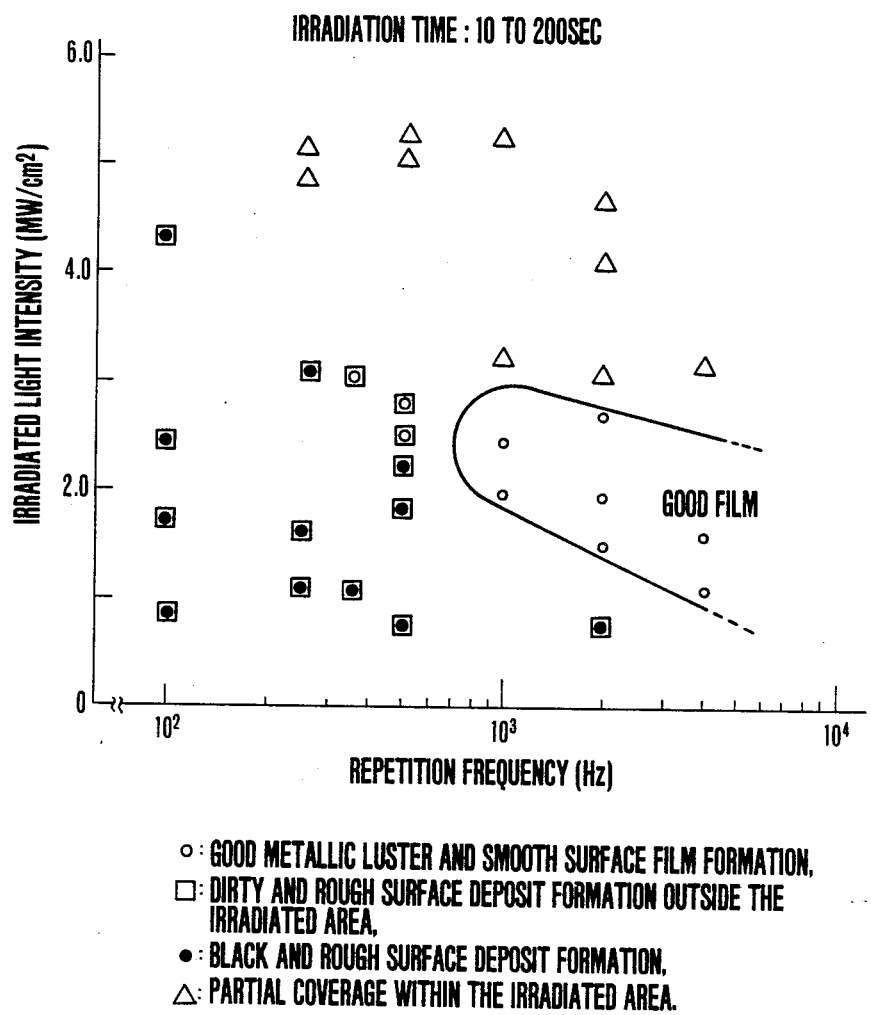
FIG. 2 is a graph showing a typical effect of the apparatus shown in FIG. 1.

FIG. 2 shows the dependency of the film quality on process conditions when a 12 μm square Cr film is deposited on the quartz glass substrate. As shown in FIG. 2, for each data point, the best film quality was marked among deposits obtained with changing irradiation time from 10 to 200 s.

As is apparent from FIG. 2, deposits (each indicated by a circle) of good quality can be obtained at a repetition frequency of about 400 Hz or more. In order to prevent a deposit (indicated by a square) of a thin film around the irradiation area, a repetition frequency of 1 kHz or more is required. In addition, the following points are clarified in accordance with film quality mapping in the case of other deposition areas. When the diameter of the deposition area is decreased from several tens of microns to several microns, (1) a good deposit is obtained only when the repetition frequency is 400 Hz or more; (2) although the film quality is degraded when the repetition frequency is excessively high, the allowable upper limit is gradually increased with a decrease in deposition area; and (3) the allowable range of the irradiation intensity for obtaining a good film is given such that the upper limit is determined by evaporation of the deposited film upon irradiation of light and the lower limit is determined by the heating effect for obtaining the good film. These upper and lower limits are decreased and a difference between the upper and lower limits tends to be decreased in accordance with a decrease in deposition area.

As described previously, no conventional system has so far been provided to repair pinholes of the photomask, although such a system has been demanded for a long period of time. However, the method and apparatus for inducing a photochemical reaction according to the present invention resolves this conventional problem.

In the above embodiment, the AOQ-switching element in the continuously excited Q-switch Nd:YAG laser 1 is operated at a high frequency of 1 kHz. The control unit 11 for supplying a Q-switch trigger signal for controlling the Q-switch comprises any device incorporating a microcomputer.

The aperture mechanism 7 may comprise different types of masks having different shapes and sizes. These masks are located on a turret. In this case, a control unit can be obtained such that a proper mask, an optimal repetition frequency and an optimal irradiation intensity are automatically selected.

In the above embodiment, the AOQ-switch Nd:YAG laser is used as a continuously excited Q-switch Nd:solid-state laser 1. However, other continuously excited laser materials such as Nd:YLF and Nd:GGG can be used in place of the Nd:YAG. The ultraviolet harmonic generator is mainly exemplified by the fourth harmonic generator. However, a third harmonic beam (354 nm) and a fifth harmonic beam (213 nm) can be used in association with the absorption wavelength of the CVD gas. The third harmonic can be generated by a phase-matched nonlinear optical crystal for generating a sum of the second harmonic (532 nm) and the fundamental wave (1.064 μm). The fifth harmonic can be generated by a phase-matched nonlinear optical crystal generating a sum of the fourth harmonic and the fundamental wave, or a sum of the second harmonic and the third harmonic. The present invention is exemplified by photo CVD Cr deposition. However, the present invention can also be applied to CVD process of other metals, insulators and semiconductors and to other processes such as photoetching. In the above embodiment, $Cr(CO)_6$ powder is used to perform CVD. However, other liquid or gaseous CVD materials and etching materials can replace $Cr(CO)_6$ or be added thereto. It is apparent that a modification of the gas supply system does not depart from the spirit and scope of the present invention.

In the above embodiment, the pulsed light source generates the fourth harmonic of the Nd:YAG laser. However, since the heating effect of the pulsed light beam and its cooling process influence the film formation, another visible light pulsed laser source or a light source for chopping the continuously excited laser output can be used to obtain the same effect as the embodiment described above. Such a light source can be used to provide a method and apparatus for inducing a photochemical reaction.

What is claimed is:

1. A method of inducing a photochemical reaction to form a film in a micro-area on a substrate, comprising the steps of:

placing said substrate in a closed cell with a window for transmitting an ultraviolet beam therethrough, said substrate being located to oppose said window;

filling a chromium gas subjected to the photochemical reaction upon irradiation of the ultraviolet beam in said cell;

emitting ultraviolet pulses with adjustable pulse repetition frequency of at least 400 hz at a predetermined intensity with a single laser;

adjusting and setting an ultraviolet beam size and shape of at most 100 μm diameter in accordance with a size and shape of an irradiation portion of said substrate;

adjusting and setting the repetition frequency of the ultraviolet beam so as to optimize a thickness of a gas adsorption layer formed in the micro- area immediately prior to a radiation of each of said ultraviolet pulses, for the adjusted ultraviolet beam size and shape; and radiating the ultraviolet beam having the set beam size and shape at the repetition frequency through said window of said cell.

2. A method as in claim 1, wherein the photochemical reaction is photochemical vapor deposition.

3. A method as in claim 1, wherein the photochemical reaction is laser chemical vapor deposition.

4. A method according to claim 1, wherein the ultraviolet light source is a continuously excited Q-switch Nd:solid-state laser.

5. An apparatus for inducing a photochemical reaction to form a film in a micro-area on a substrate, comprising:

a cell having a window for transmitting an ultraviolet beam therethrough and a holding mechanism for holding said substrate;

a gas supply system for supplying a chromium carbonyl gas subjected to the photochemical reaction upon radiation of the ultraviolet beam;

a single continuously excited Q-switch Nd:solid-state laser having a repetition frequency which is adjustably set at at least 400 Hz by a laser control signal;

an ultraviolet harmonic generator for receiving an output from said continuously excited Q-switch Nd:solid-state laser and generating ultraviolet harmonic pulses;

an optical system for guiding the ultraviolet harmonic pulses from said ultraviolet harmonic generator onto said substrate through said window and adjustably setting an ultraviolet beam size and shape of at most 100 $\mu$m diameter in accordance with an irradiation area and a shape of said substrate; and a control unit for supplying an optical system control signal to said optical system and said laser control signal to said continuously excited Q-switch Nd:solid-state laser and controlling the beam size and the repetition frequency so as to optimize a thickness of a gas adsorption layer formed in the micro- area immediately prior to a radiation of each of said ultraviolet harmonic pulses.

6. An apparatus as in claim 5, wherein the photochemical reaction is photochemical vapor deposition.

7. An apparatus as in claim 5, wherein the photochemical reaction is laser chemical vapor deposition.

* * * * *

UNITED STATES PATENT AND TRADEMARK OFFICE
CERTIFICATE OF CORRECTION

PATENT NO. : 4,976,930

DATED : December 11, 1990

INVENTOR(S) : Shunji Kishida; Hiroyuki Yokoyama; Yukio Morishige; and Kunihiko Washio It is certified that error appears in the above-identified patent and that said Letters Patent is hereby corrected as shown below:

In the Abstract, line 5, delete "phtoochemical" and insert --photochemical--.

In column 4, line 48, delete "leads" and insert --lead--.

In column 4, line 62, delete "substate" and insert --substrate--.

Col. 8, line 54, delete "clock" and insert --cock--.

In column 10, line 47, after "chromium" insert --carbonyl--.

Signed and Sealed this

Twenty-second Day of December, 1992

*Attest:*

DOUGLAS B. COMER

*Attesting Officer*   *Acting Commissioner of Patents and Trademarks*